(12) United States Patent
Kim et al.

(10) Patent No.: US 12,543,292 B2
(45) Date of Patent: Feb. 3, 2026

(54) WATER SUPPLY MODULE AND ELECTRIC DEVICE COOLING SYSTEM COMPRISING SAME

(71) Applicants: Hyundai Motor Company, Seoul (KR); Kia Corporation, Seoul (KR); Hanon Systems, Daejeon (KR)

(72) Inventors: Yeonho Kim, Seoul (KR); Hochan An, Hwaseong-si (KR); Jeawan Kim, Hwaseong-si (KR); Hoyoung Jeong, Daegu (KR); Jae Yeon Kim, Hwaseong-si (KR); Man Hee Park, Suwon-si (KR); Jeong Wan Han, Daejeon (KR); Ho Sung Kang, Daejeon (KR); Hyuk Kim, Daejeon (KR); Ji Hoon Choi, Daejeon (KR)

(73) Assignees: HYUNDAI MOTOR COMPANY, Seoul (KR); KIA CORPORATION, Seoul (KR); HANON SYSTEMS, Daejeon (KR)

( * ) Notice: Subject to any disclaimer, the term of this patent is extended or adjusted under 35 U.S.C. 154(b) by 290 days.

(21) Appl. No.: 18/026,273

(22) PCT Filed: Sep. 7, 2021

(86) PCT No.: PCT/KR2021/012109
§ 371 (c)(1),
(2) Date: Mar. 14, 2023

(87) PCT Pub. No.: WO2022/059988
PCT Pub. Date: Mar. 24, 2022

(65) Prior Publication Data
US 2023/0363108 A1    Nov. 9, 2023

(30) Foreign Application Priority Data

Sep. 18, 2020  (KR) .......................... 10-2020-0120427
Aug. 27, 2021  (KR) .......................... 10-2021-0114009

(51) Int. Cl.
*H05K 7/20*    (2006.01)
*H01M 10/6568*    (2014.01)

(52) U.S. Cl.
CPC ..... *H05K 7/20272* (2013.01); *H05K 7/20263* (2013.01); *H05K 7/20281* (2013.01); *H01M 10/6568* (2015.04)

(58) Field of Classification Search
CPC .......... H05K 7/20272; H05K 7/20263; H05K 7/20281; H01M 10/6568; F01P 2050/24
See application file for complete search history.

(56) References Cited

U.S. PATENT DOCUMENTS 10,798,851 B1 *  10/2020  Weber ................ H05K 7/20327
2012/0168138 A1 *  7/2012  Myers .................... F28F 27/02
165/200

(Continued)

FOREIGN PATENT DOCUMENTS

CN    109562685 A    4/2019
CN    110758060 A    2/2020
(Continued)

OTHER PUBLICATIONS

Pdf is translation of foreign reference WO-2019139022-A1 (Year: 2019).*

*Primary Examiner* — Len Tran
*Assistant Examiner* — Kamran Tavakoldavani
(74) *Attorney, Agent, or Firm* — SLATER MATSIL, LLP

(57) ABSTRACT

An embodiment water supply module includes a reservoir tank partitioned to accommodate a first coolant and a second coolant having different temperatures. A heat exchanger is coupled to the reservoir tank and includes a first coolant passage and a second coolant passage through which the first coolant and the second coolant flow and a refrigerant passage capable of exchanging heat with the first coolant passage and the second coolant passage. A controller is (Continued)

coupled to the reservoir tank and includes a directional control valve configured to control a flow of the first coolant and the second coolant in a plurality of directions.

18 Claims, 12 Drawing Sheets

(56) References Cited

U.S. PATENT DOCUMENTS

| | | |
|---|---|---|
| 2017/0297408 A1 | 10/2017 | Kim et al. |
| 2017/0373359 A1 | 12/2017 | Krull et al. |
| 2019/0341661 A1* | 11/2019 | Guerra .................... B60L 53/16 |
| 2020/0031191 A1 | 1/2020 | Oh et al. |
| 2020/0079177 A1 | 3/2020 | Ferraris et al. |
| 2020/0383237 A1* | 12/2020 | Hashimoto ........ H05K 7/20272 |

FOREIGN PATENT DOCUMENTS

| | | | |
|---|---|---|---|
| CN | 111033881 A | 4/2020 | |
| KR | 20160053806 A | 5/2016 | |
| KR | 101765578 B1 | 8/2017 | |
| KR | 20180136633 A | 12/2018 | |
| KR | 20190019178 A | 2/2019 | |
| KR | 20200011844 A | 2/2020 | |
| WO | WO-2019139022 A1 * | 7/2019 | ........ H01M 10/6556 |

* cited by examiner

<First mode>

<Second mode>

<Third mode>

WATER SUPPLY MODULE AND ELECTRIC DEVICE COOLING SYSTEM COMPRISING SAME

CROSS-REFERENCE TO RELATED APPLICATIONS

This application is a national stage application of International Application No. PCT/KR2021/012109, filed on Sep. 7, 2021, which claims priority to Korean Patent Application No. 10-2020-0120427, filed on Sep. 18, 2020, and Korean Patent Application No. 10-2021-0114009, filed on Aug. 27, 2021, which applications are hereby incorporated herein by reference.

TECHNICAL FIELD

The present invention relates to a water supply module and an electric device cooling system including the same.

BACKGROUND

Recently, due to energy efficiency and environmental pollution problems, there is a demand for the development of eco-friendly vehicles that may substantially replace internal combustion engine vehicles.

Eco-friendly vehicles are largely divided into electric vehicles or hydrogen vehicles that use a battery, a fuel cell as an energy source, and hybrid vehicles that are driven using an engine and a battery, or the like. Such an eco-friendly vehicle includes not only an engine cooling system that manages cooling and temperature raising of the engine, but also an electric device cooling system that manages the heat of electrical components including an electric motor.

The electric device cooling system mainly cools power electronics, actuators, a hybrid starter generator (HSG), or the like, using coolant, and has a structure that increases the temperature of the battery by causing the coolant to bypass a radiator through a bypass circuit, and at the same time passing through the battery using waste heat of the power electronics (PE) in the cold season.

However, the electric device cooling system of an eco-friendly vehicle should satisfy various purposes, such as heating, cooling, and waste heat recovery, from a plurality of water supply module components, but has a problem in that due to limitations of a layout space in a vehicle, the difficulty of arranging each component, designing a hose route, and connecting them increases, in mounting each component on a vehicle, a lot of man-hours are required to individually mount and connect each component and hose, and due to the complicated route, the flow resistance on the coolant side is high, and as a result, a high load is applied to the water pump.

KR 10-1765578 B1, published on Jul. 10, 2012, may describe information related to embodiments of the present disclosure.

SUMMARY

The present invention relates to a water supply module and an electric device cooling system including the same. Particular embodiments relate to a water supply module capable of integrating and connecting various parts used for cooling and heating in an eco-friendly vehicle and an electric device cooling system including the same.

Embodiments of the present invention provide a water supply module and an electric device cooling system including the same having advantages of reducing the number of parts and man-hours by integrally connecting each part of a cooling system, increasing installation convenience through modularization, reducing a load of a water pump, and increasing a scalability of coupling of part.

An exemplary embodiment of the present invention provides a water supply module, including a reservoir tank in which first coolant and second coolant having different temperatures are partitioned and accommodated, a heat exchanger having coolant passages through which the first and the second coolant flow and a refrigerant passage capable of exchanging heat with the coolant passages, the heat exchanger being coupled to the reservoir tank, and a controller coupled to the reservoir tank and including a directional control valve for controlling the flow of coolant in a plurality of directions.

An inner space of the reservoir tank may be partitioned by a partition wall to form a first accommodating part accommodating the first coolant and a second accommodating part accommodating the second coolant.

The first coolant and the second coolant may flow separately without mixing with each other.

The directional control valve may be connected to the reservoir tank and the heat exchanger to control the flow of coolant in six directions.

The water supply module may further include a first coolant pump and a second coolant pump coupled to the controller and communicating with the controller, in which an inner space of the reservoir tank may be partitioned by the partition wall to form a first accommodating part accommodating the first coolant and a second accommodating part accommodating the second coolant. In the heat exchanger, the first coolant and the second coolant may be partitioned and flow, the reservoir tank may be provided with a through passage through which the heat exchanger and the controller disposed on an opposite side communicate with each other, and which does not communicate with the first accommodating part and the second accommodating parts of the reservoir tank. The controller may communicate with the first accommodating part and the second accommodating part of the reservoir tank, respectively, the controller may communicate with the first coolant passage and the second coolant passage of the heat exchanger, respectively, and the controller may control the flow of the coolant in at least six directions.

A coolant inlet of the first coolant pump may be connected to a first outlet of the controller, and a coolant inlet of the second coolant pump may be connected to a second outlet of the controller, a 1-1th inlet of the controller into which the first coolant flows may be connected to the first accommodating part of the reservoir tank, a 2-1th inlet of the controller into which the second coolant flows may be connected to the second accommodating part of the reservoir tank, a 1-2th inlet of the controller into which the first coolant flows may be connected to a first coolant outlet of the heat exchanger, and a 2-2th inlet of the controller in which the second coolant flows may be connected to a second coolant outlet of the heat exchanger.

The reservoir tank may have a first through passage penetrating through the first accommodating part but shielded from the inner space of the first accommodating part and a second through passage passing through the second accommodating part but shielded from the inner space of the second accommodating part, the 1-2th inlet of the controller and the first coolant outlet of the heat exchanger may be connected through the first through passage, and the 2-2th inlet of the controller and the second coolant outlet of the heat exchanger may be connected through the second through passage.

The reservoir tank may have a first mounting part concavely formed on one side in a longitudinal direction, so a heat exchanger may be mounted on the first mounting part, and the reservoir tank may have a second mounting part concavely formed on the other side in the longitudinal direction, so the controller may be mounted on the second mounting part.

The controller, the first coolant pump, and the second coolant pump may be configured in an integral assembly, and a first coolant pump may be mounted on one side of the controller in a width direction of the controller and a second coolant pump may be mounted on the other side in the width direction of the controller.

The controller further may include a case formed with the 1-1th inlet, the 1-2th inlet, the 2-1th inlet, and the 2-2th inlet through which the coolant flows and the first outlet and the second outlet through which the coolant is discharged, a directional control valve may be provided inside the case, and the inlets and outlets of the controller may be connected to correspond to six ports of the directional control valve.

The controller may further include a control unit controlling operations of the first coolant pump, the second coolant pump, and the directional control valve.

The directional control valve may include a housing formed with six ports and a rotating body provided inside the housing to partition the inner space of the housing into four areas and to be rotatable around a center.

Among the six ports, a first port may be connected to the first accommodating part of the reservoir tank, a second port may be connected to the first coolant pump, a third port may be connected to the first coolant outlet of the heat exchanger, a fourth port may be connected to the second accommodating part of the reservoir tank, a fifth port may be connected to the second coolant pump, and a sixth port may be connected to the second coolant outlet of the heat exchanger.

In the first mode according to a rotational position of the rotating body, the first accommodating part of the reservoir tank may communicate with the first coolant pump and the second accommodating part of the reservoir tank may communicate with the second coolant pump.

In the second mode according to a rotational position of the rotating body, the first coolant outlet of the heat exchanger may communicate with the first coolant pump and the second coolant outlet of the heat exchanger may communicate with the second coolant pump.

In the third mode according to a rotational position of the rotating body, the first accommodating part of the reservoir tank may communicate with the first coolant pump and the second coolant outlet of the heat exchanger may communicate with the second coolant pump.

Another exemplary embodiment of the present invention provides an electric device cooling system including the water supply module according to embodiments of the present invention, a first electrical component connected between a coolant outlet of the first coolant pump and a first coolant inlet of the heat exchanger, the coolant outlet of the first coolant pump and the first coolant inlet of the heat exchanger being connected, and a second electrical component connected between a coolant outlet of the second coolant pump and a second coolant inlet of the heat exchanger, the coolant outlet of the second coolant pump and the second coolant inlet of the heat exchanger being connected.

A first accommodating part of the reservoir tank and a first coolant inlet of the heat exchanger may be connected in parallel to the first electrical component, and a second accommodating part of the reservoir tank and the second coolant inlet of the heat exchanger may be connected in parallel to the second electrical component.

The electric device cooling system may further include: a first radiator connected between the coolant outlet of the first electrical component and the first accommodating part of the reservoir tank; and a second radiator connected between the coolant outlet of the second electrical component and the second accommodating part of the reservoir tank.

According to a water supply module and an electric device cooling system including the same according to an exemplary embodiment of the present invention, it is possible to reduce a size and weight of a cooling system by removing hoses or pipes or reducing a length of the pipes through integration of parts constituting the cooling system.

In addition, it is possible to reduce the number of parts and assembly man-hours of the cooling system, increase the mounting convenience, and improve the performance and durability of the cooling system.

In addition, it is possible to lower the flow resistance of a coolant side acting on the cooling system, and thus, reduce a load applied to a water pump.

DETAILED DESCRIPTION OF ILLUSTRATIVE EMBODIMENTS

Hereinafter, a water supply cooling module and an electric device cooling system including the same according to embodiments of the present invention having the configuration as described above will be described in detail with reference to the accompanying drawings.

Figure 1:
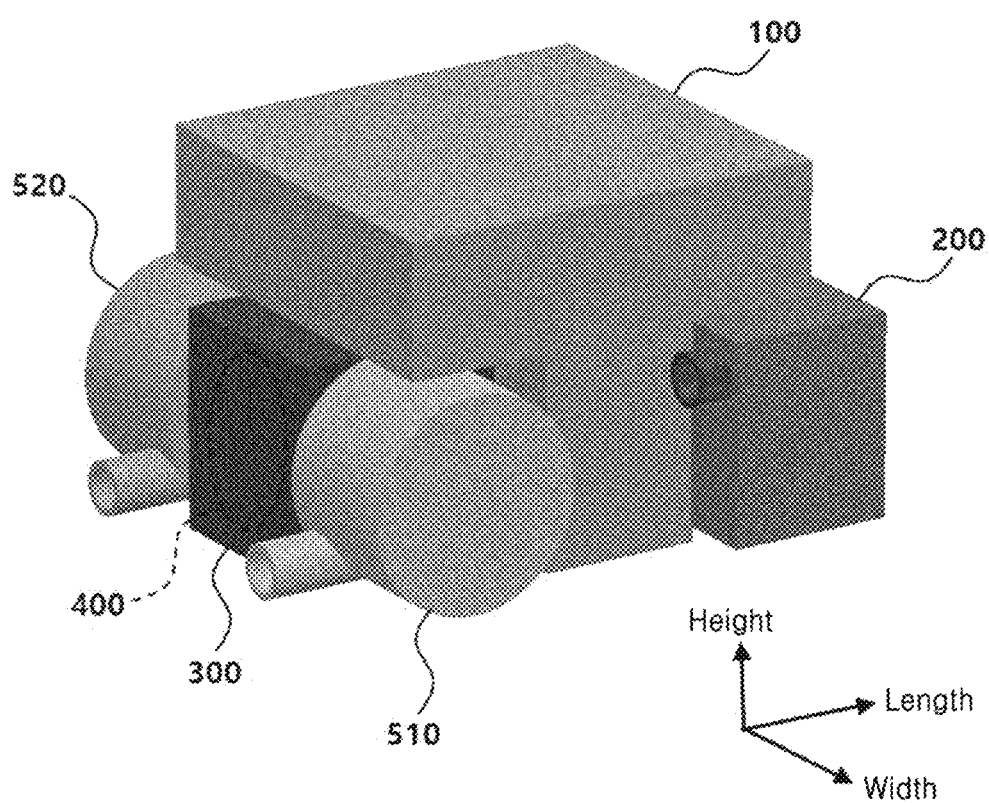
FIG. 1 is an assembled perspective view illustrating a water supply module according to an exemplary embodiment of the present invention.
Figure 2:
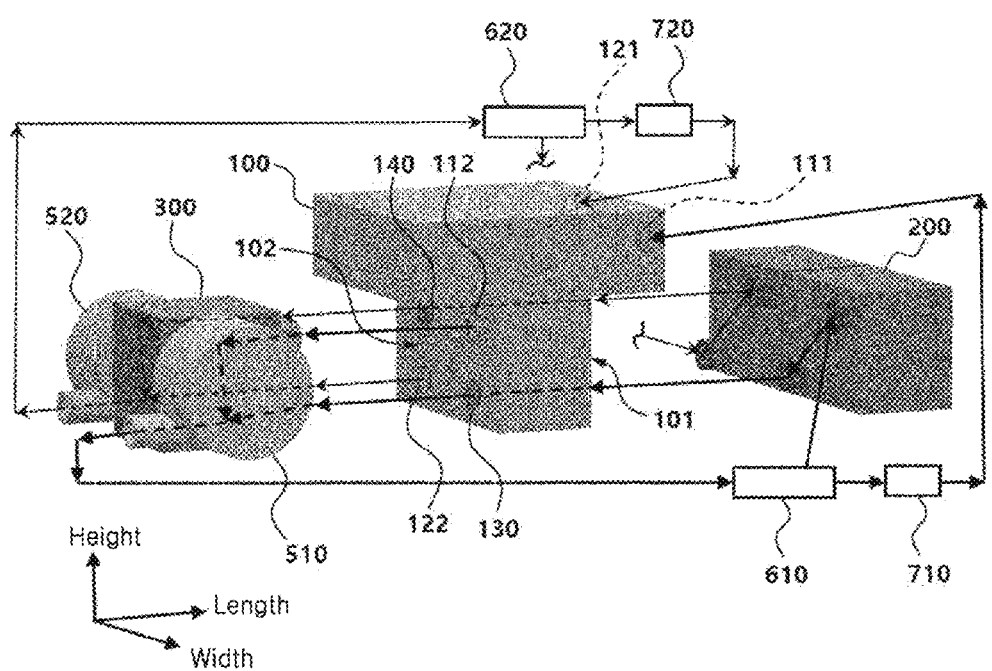
FIG. 2 is an exploded perspective view of a water supply module according to an exemplary embodiment of the present invention and a configuration diagram illustrating an electric device cooling system including the same.
Figure 3:
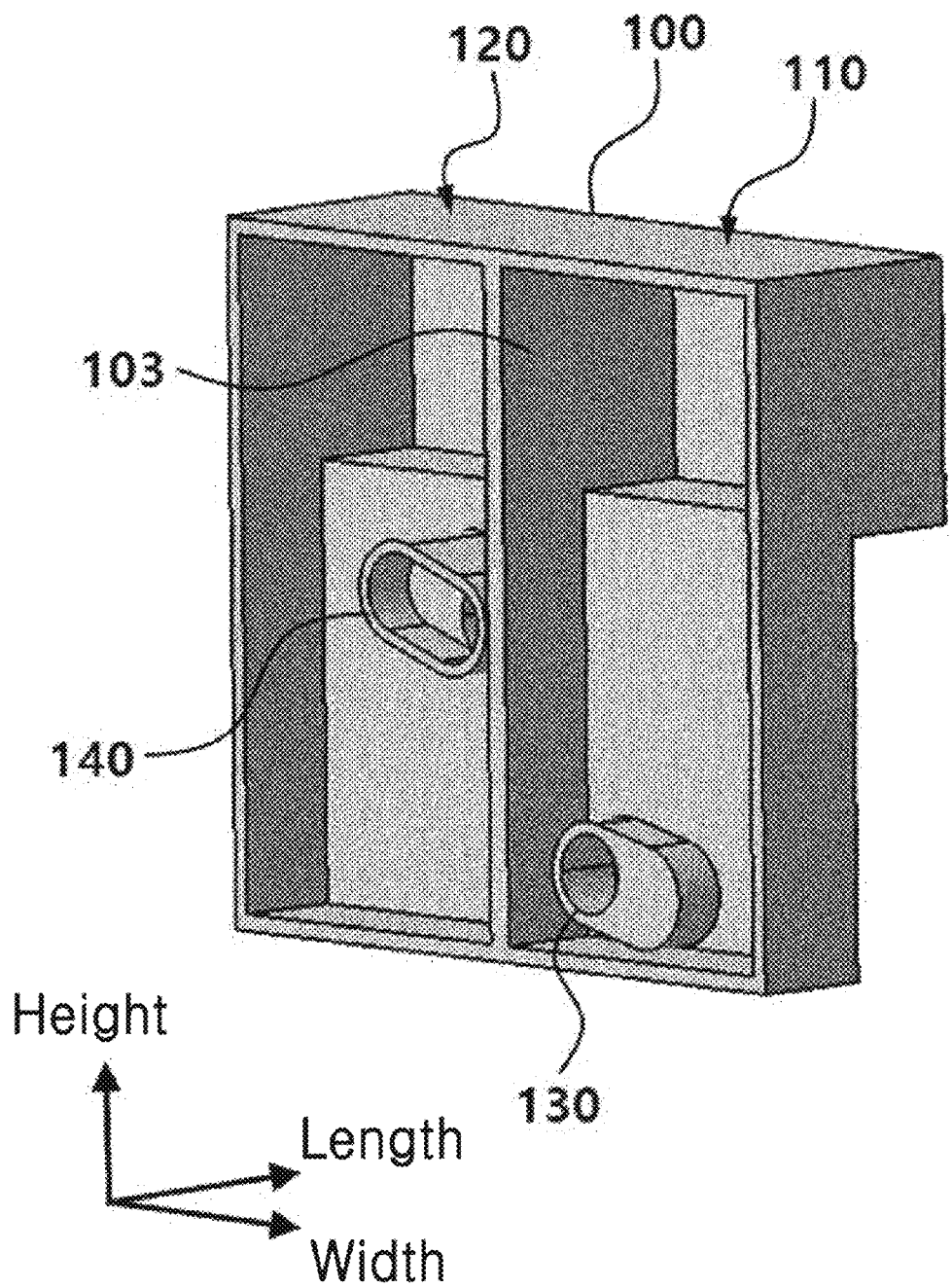
FIG. 3 is a perspective view illustrating a cross-section of a reservoir tank in a water supply module according to an exemplary embodiment of the present invention.
Figure 4A:
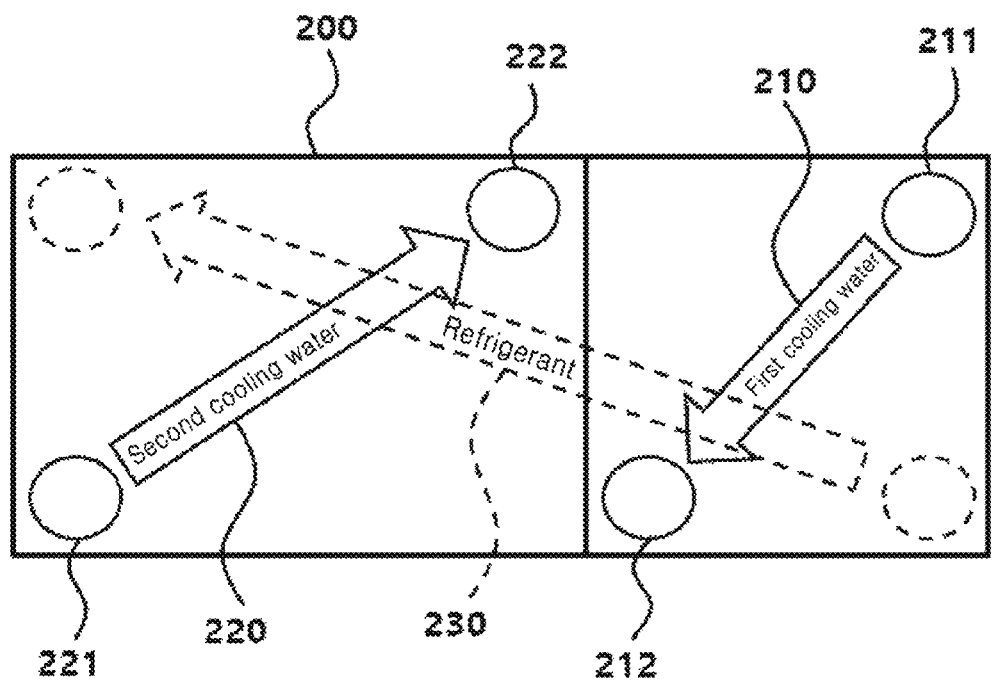
FIGS. 4A and 4B are conceptual views illustrating a front view and a top view of a heat exchanger in the water supply module according to an exemplary embodiment of the present invention.
Figure 4B:
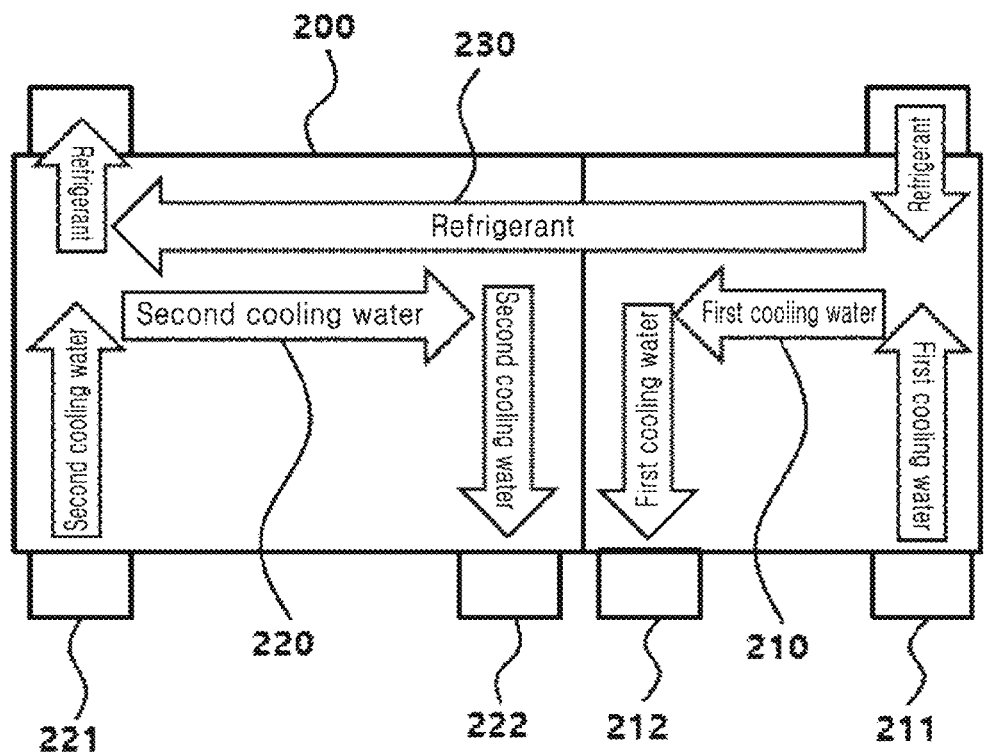
Figure 5:
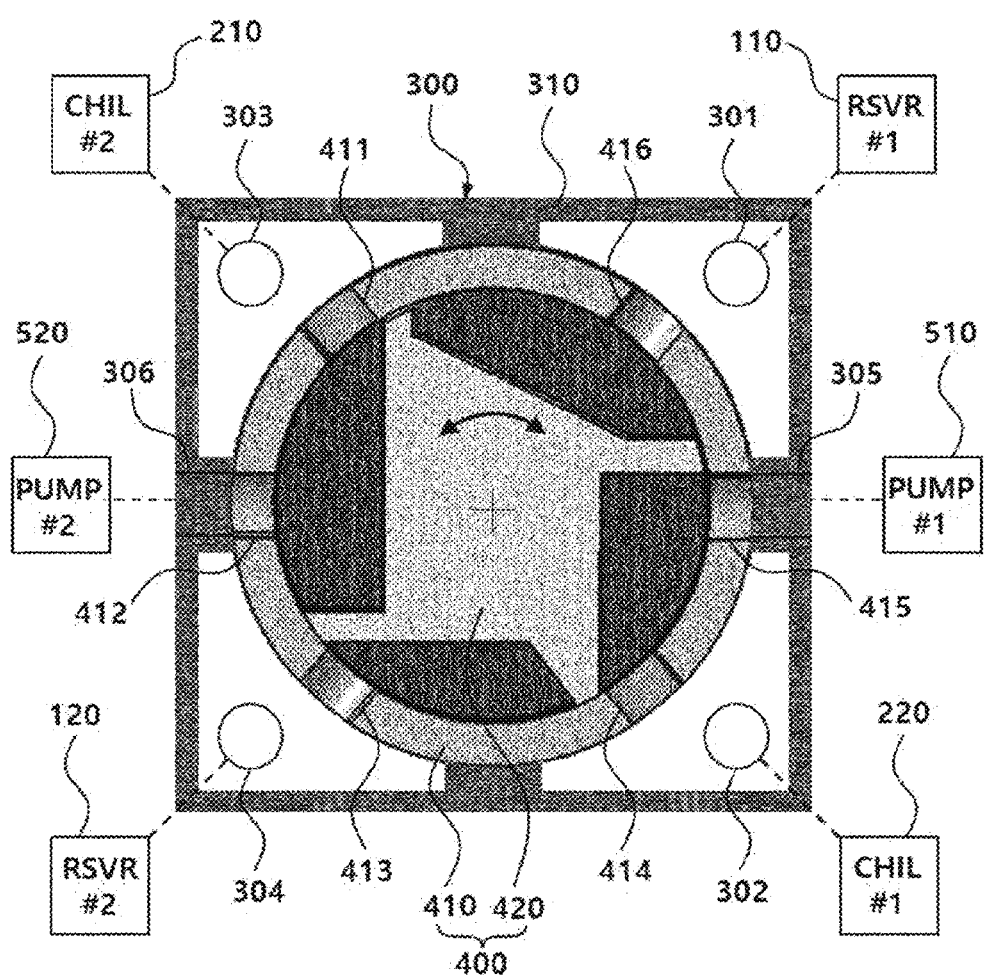
FIG. 5 is a cross-sectional view illustrating a case and a directional control valve of a controller in the water supply module according to an exemplary embodiment of the present invention.

FIG. 1 is an assembled perspective view illustrating a water supply module according to an exemplary embodiment of the present invention, FIG. 2 is an exploded perspective view of a water supply module and a configuration diagram illustrating an electric device cooling system including the same, FIG. 3 is a perspective view illustrating a cross-section of a reservoir tank in a water supply module, and FIGS. 4A and 4B are conceptual views illustrating a front view and a top view of a heat exchanger in the water supply module according to an exemplary embodiment of the present invention. FIG. 5 is a cross-sectional view illustrating a case and a directional control valve of a controller.

As illustrated, the water supply module according to an exemplary embodiment of the present invention may largely include a reservoir tank 100, a heat exchanger 200, a controller 300, a directional control valve 400, a first coolant pump 510, and a second coolant pump 520.

In addition, the electric device cooling system may be configured to include the water supply module, a first electrical component 610, and a second electrical component 620, and may further include a first radiator 710 and a second radiator 720.

The reservoir tank 100 serves to store and supply the first coolant and the second coolant flowing along different paths, and may be configured so that the first coolant and the second coolant do not mix with each other.

For example, the reservoir tank 100 may be formed in the form in which a container in which an empty space accommodating coolant is formed is provided with a partition wall 103 partitioning an inner space.

In the reservoir tank 100, the first accommodating part 110 accommodating the first coolant and the second accommodating part 120 accommodating the second coolant may be integrally formed.

In addition, the reservoir tank may be formed in various forms. In addition, the reservoir tank 100 has a first mounting part 101 concavely formed on one side in a longitudinal direction, so the heat exchanger 200 is mounted on the first mounting part 101, and the reservoir tank 100 has a second mounting part 102 concavely formed on the other side in the longitudinal direction, so a controller may be mounted on the second mounting part 102.

In addition, the reservoir tank 100 has a first through passage 130 penetrating through the first accommodating part 110 but shielded from the inner space of the first accommodating part 110 and a second through passage 140 passing through the second accommodating part 120 but shielded from the inner space of the second accommodating part 120.

That is, the first through passage 130 is formed in a form penetrating through one side surface in the longitudinal direction on which the first mounting part 101 is formed and the other side surface in the longitudinal direction on which the second mounting part 102 is formed, and is formed so that a space between the inlet and the outlet of the first through passage 130 does not communicate with the inner space of the first accommodating part no.

Similarly, the second through passage 140 is formed in a form penetrating through one side surface in the longitudinal direction on which the first mounting part 101 is formed and the other side surface in the longitudinal direction on which the second mounting part 102 is formed, and is formed so that a space between the inlet and the outlet of the second through passage 140 does not communicate with the inner space of the second accommodating part 120.

The heat exchanger 200 may be, for example, a chiller that transfers heat generated from a power electronics (PE) component or a battery, which are electrical components, to a refrigerant.

The heat exchanger 200 may be formed in a structure in which the first coolant flowing along the first electrical component 610 and the second coolant flowing along the second electrical component 620 may not mix with each other, and both the first coolant and the second coolant may exchange heat with the refrigerant.

That is, as illustrated, the inside of the heat exchanger 200 may be provided with a first coolant passage 210 through which the first coolant may flow and a second coolant passage 220 through which the second coolant may flow separately.

Also, a first coolant inlet 211 and a first coolant outlet 212 communicating with the first coolant passage 210 may be formed on a surface of the reservoir tank 100 facing the first mounting part 101.

In addition, a second coolant inlet 221 and a second coolant outlet 222 communicating with the second coolant passage 220 may be formed on the surface of the reservoir tank 100 facing the first mounting part 101.

Thus, the heat exchanger 200 is mounted on the first mounting part 101 of the reservoir tank 100, so the first coolant outlet 112 of the heat exchanger 200 may be connected to the inlet of the first through passage 130 of the reservoir tank 100 and the second coolant outlet 122 may be connected to the inlet of the second through passage 140.

Here, the first coolant inlet 111 and the second coolant inlet 121 of the heat exchanger 200 may be disposed to be exposed to the outside of the reservoir tank 100.

In addition, the heat exchanger 200 may have a refrigerant passage 230 through which the refrigerant flows, and the refrigerant passage 230 may be formed adjacent to both the first coolant passage 210 and the second coolant passage 220.

The controller 300 is connected to the reservoir tank 100, the heat exchanger 200, the first coolant pump 510, and the second coolant pump 520, and the controller 300 may include a directional control valve (6-way valve) 400 that may control the flow of coolant in six directions therein.

For example, the controller 300 may include a case 310 and a directional control valve 400 provided therein, and the case 310 may be provided with a 1-1th inlet 301, a 1-2th inlet 302, a 2-1th inlet 303, and a 2-2th inlet 304, which are four inlets into which the coolant flows, formed on the surface of the reservoir tank 100 facing the second mounting part 102.

Therefore, the controller 300 is mounted on the second mounting part 102 of the reservoir tank 100, so the 1-1th inlet 301 may be connected to the coolant outlet of the first accommodating part no, the 1-2th inlet 302 may be connected to the outlet of the first through passage 130, the 2-1th inlet 303 may be connected to the coolant outlet of the second accommodating part 120, and the 2-2th inlet 304 may be connected to the outlet of the second through passage 140.

In addition, one side surface of the case 310 of the controller 300 in a width direction may be provided with a first outlet 305 through which coolant is discharged and the other side surface thereof in the width direction may be provided with a second outlet 306 through which coolant is discharged.

The directional control valve 400 may include a housing 410 and a rotating body 420 provided inside the housing 410 and rotatably formed around a center.

For example, the housing 410 may be formed in a cylindrical shape, and the housing 410 may include six ports, including a first port 411, a second port 412, a third port 413, a fourth port 414, a fifth port 415, and a sixth port 416, that penetrate through an outer circumferential surface and an inner circumferential surface, and are formed spaced apart along a circumferential direction.

Further, the rotating body 420 may be formed in various shapes such that the inner space of the housing 410 may be divided into four regions by being coupled with the housing 410.

Here, two ports adjacent to each other may be connected to each other or disconnected from each other according to the rotated position of the rotating body 420.

In addition, two adjacent ports may be connected to each other on the opposite side to which the two adjacent ports are connected based on the rotation center. In addition, the connection of the remaining two ports except for the ports connected to each other may be blocked.

In addition, the directional control valve 400 may be provided inside the case 310 of the controller 300, and the housing 410 of the directional control valve 400 may be coupled and fixed to an inner side surface of the case 310.

Therefore, the 1-1th inlet 301 of the case 310 may be in communication with the first port 411, the 1-2th inlet 302 may be in communication with the third port 413, the 2-1th inlet 303 may be in communication with the sixth port 416, and the 2-2th inlet 304 may be in communication with the fourth port 414.

Also, the first outlet 305 of the case 310 may be in communication with the second port 412, and the second outlet 306 may be in communication with the fifth port 415.

The first coolant pump 510 is connected to the controller 300 to serve to pressurize the first coolant. The first coolant pump 510 may be coupled to one side of the controller 300 in the width direction, and a coolant inlet of the first coolant pump 510 may be connected to the first outlet 305 of the case 310.

The second coolant pump 520 is connected to the controller 300 to serve to pressurize the second coolant.

The second coolant pump 520 may be coupled to the other side of the controller 300 in the width direction, and the coolant inlet of the second coolant pump 520 may be connected to the second outlet 306 of the case 310.

Here, the first coolant pump 510 and the second coolant pump 520 may face each other around the controller 300.

In addition, the coolant inlet of the first coolant pump 510 and the coolant inlet of the second coolant pump 520 may be disposed to face each other, and the coolant outlet of the first coolant pump 510 and the coolant outlet of the second coolant pump 520 may be formed on the same side as each other.

In addition, the controller 300 including the directional control valve 400, the first coolant pump 510, and the second coolant pump 520 are configured as an integral assembly in which they are assembled, and may be coupled to the reservoir tank 100 in the assembled state.

In addition, although not illustrated, the controller 300 may further include a controller for controlling the operation of the first coolant pump 510, the second coolant pump 520, and the directional control valve 400, and the controller 300 may further include a driving unit capable of controlling the rotational position of the rotating body 420 in the directional control valve 400.

Here, the directional control valve 400 may be operated in the following three modes according to the rotational position of the rotating body 420.

Figure 6:
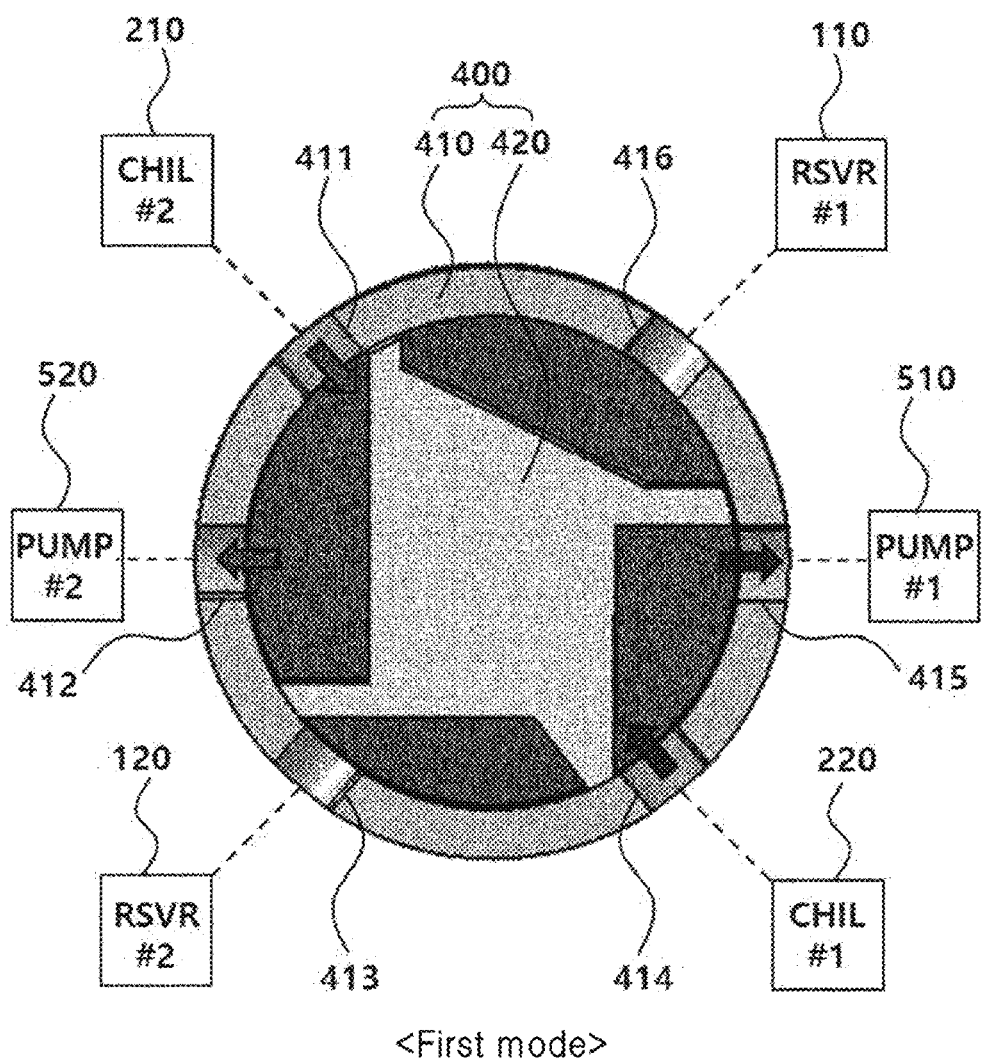
FIGS. 6 to 8 are cross-sectional views illustrating a flow of coolant under the control of the directional control valve in the water supply module according to an exemplary embodiment of the present invention.

Referring to FIG. 6, in the first mode, the first accommodating part 110 of the reservoir tank 100 and the first coolant pump 510 may communicate with each other and the second accommodating part 120 of the reservoir tank 100 and the first coolant pump 510 may communicate with each other.

That is, the first port 411 and the second port 412 of the directional control valve 400 communicate with each other, the fourth port 414 and the fifth port 415 communicate with each other, and the third port 413 and the sixth port 416 are disconnected from each other.

Therefore, both the first coolant and the second coolant may not flow from the heat exchanger 200 toward the directional control valve 400, the first coolant may flow from the first accommodating part 110 of the reservoir tank 100 toward the first coolant pump 510, and the second coolant may flow from the second accommodating part 120 of the reservoir tank 100 toward the second coolant pump 520.

Figure 7:
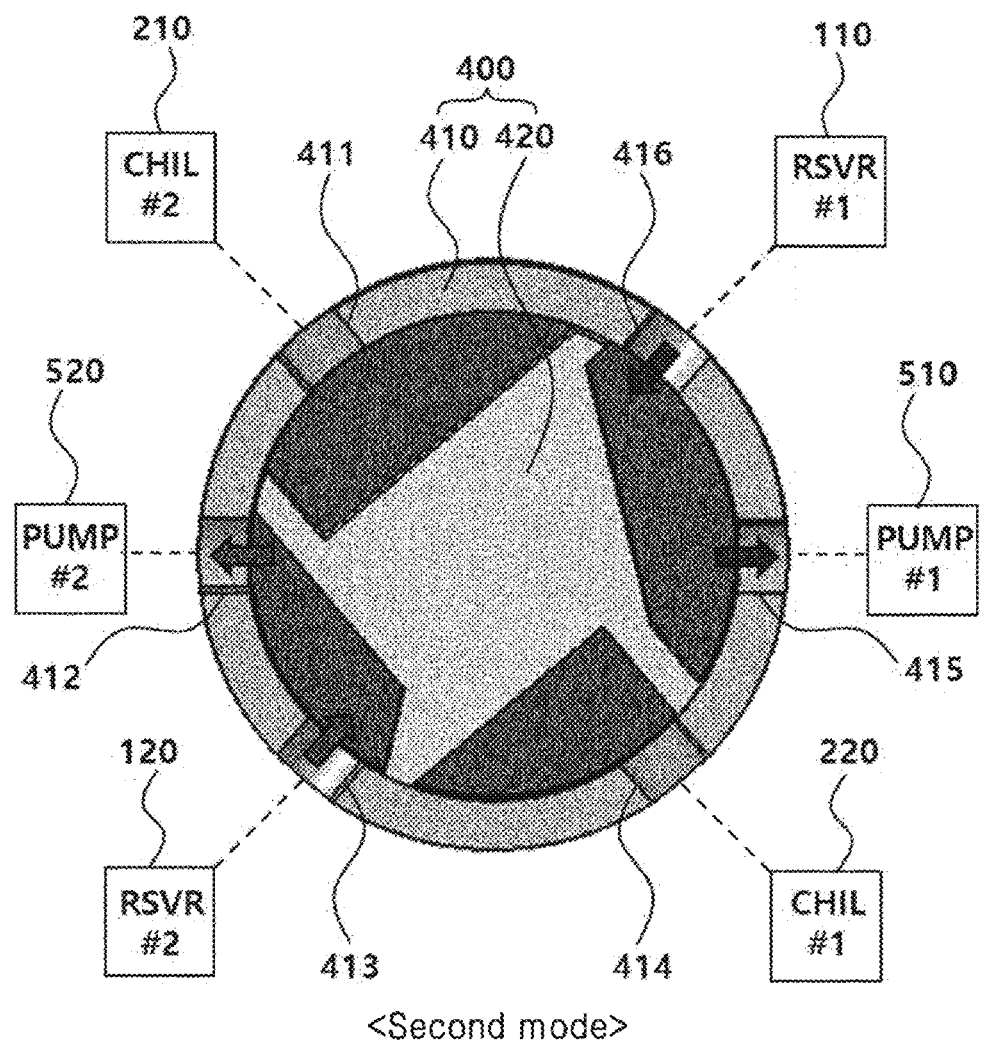

Referring to FIG. 7, in the second mode, the first coolant outlet 212 of the heat exchanger 200 and the first coolant pump 510 may communicate with each other and the second coolant outlet 222 of the heat exchanger 200 and the first coolant pump 510 may communicate with each other.

That is, the second port 412 and the third port 413 of the directional control valve 400 communicate with each other, the fifth port 415 and the sixth port 416 communicate with each other, and the first port 411 and the fourth port 414 are disconnected from each other.

Therefore, both the first coolant and the second coolant may not flow from the reservoir tank 100 toward the directional control valve 400, the first coolant may flow from the first coolant outlet 212 of the heat exchanger 200 toward the first coolant pump 510, and the second coolant may flow from the second coolant outlet 222 of the heat exchanger 200 toward the second coolant pump 520.

Figure 8:
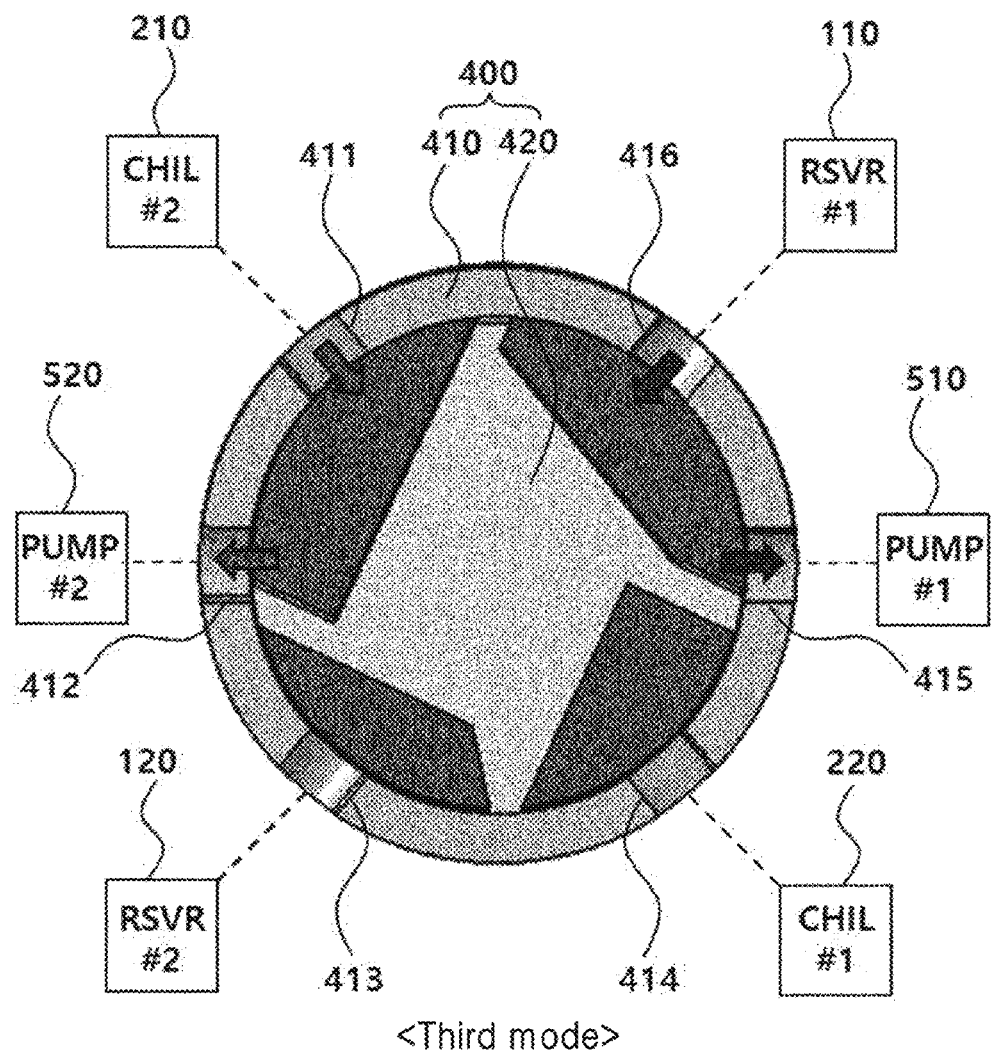

Referring to FIG. 8, in the third mode, the first accommodating part no of the reservoir tank 100 and the first coolant pump 510 may communicate with each other and the second coolant outlet 222 of the heat exchanger 200 and the second coolant pump 520 may communicate with each other.

That is, the first port 411 and the second port 412 of the directional control valve 400 communicate with each other, the fifth port 415 and the sixth port 416 communicate with each other, and the third port 413 and the fourth port 414 are disconnected from each other.

Therefore, the first coolant does not flow from the first coolant outlet 212 of the heat exchanger 200 toward the directional control valve 400, and the first coolant flows from the first accommodating part no of the reservoir tank 100 toward the first coolant pump 510.

Further, the second coolant may not flow from the second accommodating part 120 of the reservoir tank 100 toward the directional control valve 400, and the second coolant may flow from the second coolant outlet 222 of the heat exchanger 200 toward the second coolant pump 520.

Alternatively, in the third mode, when the rotating body 420 illustrated in FIG. 8 rotates 180°, the second port 412 and the third port 413 of the directional control valve 400 may communicate with each other, the fourth port 414 and the fifth port 415 may communicate with each other, and the first port 411 and the sixth port 416 may be disconnected from each other.

Therefore, the first coolant flows from the first coolant outlet 212 of the heat exchanger 200 toward the first coolant pump 510, and the first coolant does not flow from the first accommodating part no of the reservoir tank 100 toward the directional control valve 400. Further, the second coolant may flow from the second accommodating part 120 of the reservoir tank 100 toward the second coolant pump 520, and the second coolant may not flow from the second coolant outlet 222 of the heat exchanger 200 toward the directional control valve 400.

Therefore, according to the water supply module of embodiments of the present invention, it is possible to reduce a size and weight of a cooling system by removing hoses or pipes or reducing a length of the pipes through integration of parts constituting the cooling system.

In addition, in the electric device cooling system including the water supply module of embodiments of the present invention, the first electrical component 610 and the second electrical component 620 may be a PE component or a battery, and the first electrical component 610 may be connected to the first coolant passage where the coolant outlet of the first coolant pump 510 and the first coolant inlet 211 of the heat exchanger 200 are connected.

Therefore, the first coolant exchanges heat with the first electrical component 610 so that the first electrical component 610 may be cooled or heated.

In addition, the second electrical component 620 may be connected to the second coolant flow path where the coolant outlet of the second coolant pump 520 and the second coolant inlet 221 of the heat exchanger 200 are connected.

Therefore, the second coolant exchanges heat with the second electrical component 620 so that the second electrical component 620 may be cooled or heated.

In addition, the first accommodating part no of the reservoir tank 100 and the first coolant inlet 211 of the heat exchanger 200 may be connected in parallel to the coolant outlet of the first electrical component 610, and the second accommodating part 120 of the reservoir tank 100 and the second coolant inlet 221 of the heat exchanger 200 may be connected in parallel to the second electrical component 620.

Therefore, according to the control of the directional control valve 400, the flow of coolant may be formed in the three modes as described above.

In addition, a first radiator 710 may be connected between the coolant outlet of the first electrical component 610 and the first accommodating part no of the reservoir tank 100, so the first coolant may be cooled through the first radiator 710.

In addition, a second radiator 720 may be connected between the coolant outlet of the second electrical component 620 and the second accommodating part 120 of the reservoir tank 100, so the second coolant may be cooled through the second radiator 720.

In addition, the first coolant and the second coolant are maintained at different temperatures, and the flow of each coolant may be controlled according to the temperature of the electrical components and the outside temperature.

As described above, the electric device cooling system including the water supply module of embodiments of the present invention may reduce the number of parts and assembly man-hours of the cooling system and increase the convenience of mounting.

In addition, the flow resistance of the coolant side acting on the cooling system may be lowered, so the load applied to the coolant pump may be reduced, thereby improving the performance and durability of the cooling system.

Figure 9:
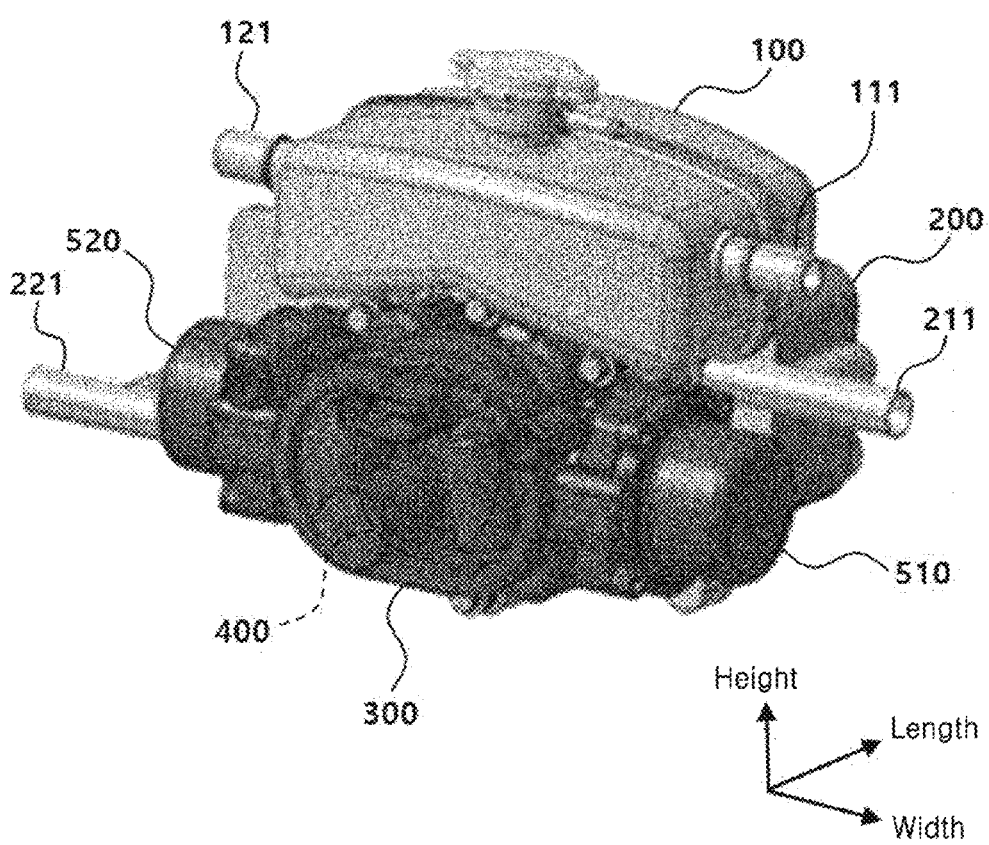
FIGS. 9 and 10 are an assembled perspective view and exploded perspective view illustrating modeling of the water supply module according to an exemplary embodiment of the present invention.
Figure 10:
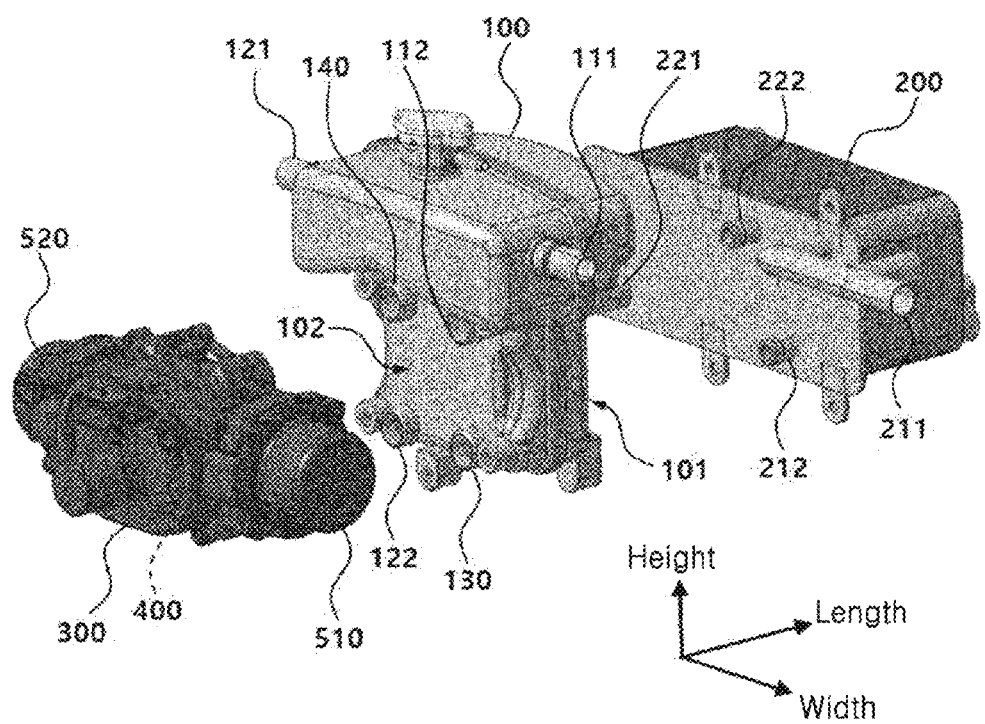
Figure 11:
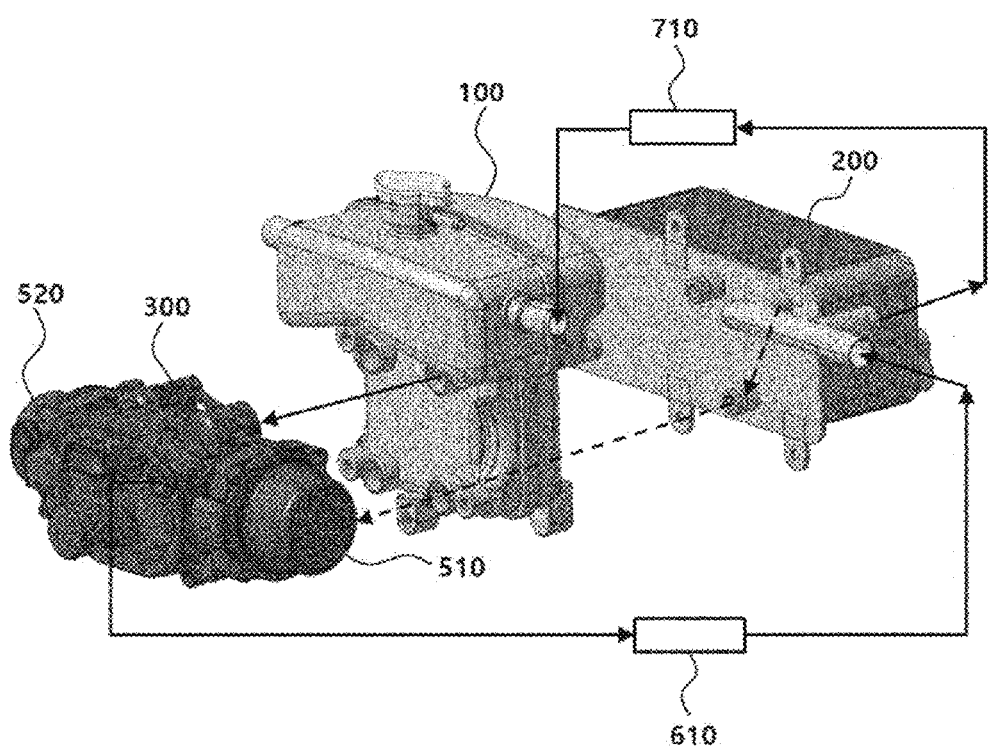
FIG. 11 is a block diagram illustrating only the flow of first coolant in the electric device cooling system including the water supply module according to an exemplary embodiment of the present invention.

FIGS. 9 and 10 are an assembled perspective view and exploded perspective view illustrating modeling of the water supply module according to an exemplary embodiment of the present invention.

As illustrated, in the water supply module according to an exemplary embodiment of the present invention, the first coolant inlet 111 and the second coolant inlet 121 of the reservoir tank 100 may be formed on the side surface in the width direction.

Also, two branch pipes are connected to the first coolant inlet 211 of the heat exchanger 200, and thus, all of the branch pipes may communicate with the first coolant inlet 211.

Similarly, two branch pipes are connected to the second coolant inlet 221, so all of the branch pipes may communicate with the second coolant inlet 221.

Thus, referring to the electric device cooling system including the water supply module according to one exemplary embodiment of the present invention of FIG. 12, the flow path of the first coolant may be formed as illustrated.

Here, the first electrical component 610 may be a battery and a coolant heater, and the first radiator 710 may be a radiator on a low temperature side.

In FIG. 12, only the flow of the first coolant is illustrated, but the second coolant may be configured to flow in the same way as the first coolant, and only the configurations of the second electrical component and the second radiator may be different.

The present invention is not limited to the abovementioned exemplary embodiments, but may be variously applied. In addition, embodiments of the present invention may be variously modified by those skilled in the art to which the present invention pertains without departing from the gist of the present invention claimed in the claims.

The invention claimed is:

1. A water supply module comprising:
   a reservoir tank that is partitioned to accommodate a first coolant and a second coolant having different temperatures;
   a heat exchanger coupled to the reservoir tank and comprising a first coolant passage and a second coolant passage through which the first coolant and the second coolant can flow and a refrigerant passage capable of exchanging heat with the first coolant passage and the second coolant passage; and
   a controller coupled to the reservoir tank and comprising a directional control valve configured to control a flow of the first coolant and the second coolant in a plurality of directions,
   wherein the directional control valve is connected to the reservoir tank and the heat exchanger and is configured to control the flow of the first coolant and the second coolant in six directions.

2. The water supply module of claim 1, further comprising a partition wall in an inner space of the reservoir tank to define a first accommodating part configured to accommodate the first coolant and a second accommodating part configured to accommodate the second coolant.

3. The water supply module of claim 1, wherein the water supply module is configured such that the first coolant and the second coolant can flow separately without mixing with each other.

4. The water supply module of claim 1, further comprising a first coolant pump and a second coolant pump coupled to and in communication with the controller, wherein:
   an inner space of the reservoir tank is partitioned by a partition wall to define a first accommodating part configured to accommodate the first coolant and a second accommodating part configured to accommodate the second coolant;
   in the heat exchanger, the first coolant and the second coolant can flow without mixing;

the reservoir tank is provided with a through passage through which the heat exchanger and the controller, which is disposed on an opposite side, communicate with each other and do not communicate with the first accommodating part and the second accommodating part of the reservoir tank; and the controller is configured to:
communicate with the first accommodating part and the second accommodating part of the reservoir tank, respectively;
communicate with the first coolant passage and the second coolant passage of the heat exchanger, respectively; and
control the flow of the first coolant and the second coolant in at least six directions.

5. The water supply module of claim 4, wherein:
a coolant inlet of the first coolant pump is connected to a first outlet of the controller;
a coolant inlet of the second coolant pump is connected to a second outlet of the controller;
a 1-1th inlet of the controller into which the first coolant flows is connected to the first accommodating part of the reservoir tank;
a 2-1th inlet of the controller into which the second coolant flows is connected to the second accommodating part of the reservoir tank; and
a 1-2th inlet of the controller into which the first coolant flows is connected to a first coolant outlet of the heat exchanger; and
a 2-2th inlet of the controller into which the second coolant flows is connected to a second coolant outlet of the heat exchanger.

6. The water supply module of claim 5, wherein:
the reservoir tank comprises:
a first through passage penetrating through the first accommodating part but shielded from the inner space of the first accommodating part; and
a second through passage passing through the second accommodating part but shielded from the inner space of the second accommodating part;
the 1-2th inlet of the controller and the first coolant outlet of the heat exchanger are connected through the first through passage; and
the 2-2th inlet of the controller and the second coolant outlet of the heat exchanger are connected through the second through passage.

7. The water supply module of claim 5, wherein:
the controller further comprises a case comprising the 1-1th inlet, the 1-2th inlet, the 2-1th inlet, and the 2-2th inlet through which the first coolant and the second coolant flow and the first outlet and the second outlet through which the first coolant and the second coolant are discharged;
the directional control valve is provided inside the case; and
the inlets and the outlets of the controller are connected to correspond to six ports of the directional control valve.

8. The water supply module of claim 5, wherein the directional control valve comprises:
a housing comprising six ports; and
a rotating body provided inside the housing to partition the inner space of the housing into four areas and to be rotatable around a center.

9. The water supply module of claim 8, wherein among the six ports, a first port is connected to the first accommodating part of the reservoir tank, a second port is connected to the first coolant pump, a third port is connected to the first coolant outlet of the heat exchanger, a fourth port is connected to the second accommodating part of the reservoir tank, a fifth port is connected to the second coolant pump, and a sixth port is connected to the second coolant outlet of the heat exchanger.

10. The water supply module of claim 9, wherein, in a first mode according to a rotational position of the rotating body, the first accommodating part of the reservoir tank is in communication with the first coolant pump and the second accommodating part of the reservoir tank is in communication with the second coolant pump.

11. The water supply module of claim 9, wherein, in a second mode according to a rotational position of the rotating body, the first coolant outlet of the heat exchanger is in communication with the first coolant pump and the second coolant outlet of the heat exchanger is in communication with the second coolant pump.

12. The water supply module of claim 9, wherein, in a third mode according to a rotational position of the rotating body, the first accommodating part of the reservoir tank is in communication with the first coolant pump and the second coolant outlet of the heat exchanger is in communication with the second coolant pump.

13. The water supply module of claim 4, wherein:
the controller, the first coolant pump, and the second coolant pump are configured in an integral assembly;
the first coolant pump is mounted on a first side of the controller in a width direction of the controller; and
the second coolant pump is mounted on a second side in the width direction of the controller.

14. The water supply module of claim 4, wherein the controller further comprises a control unit configured to control operations of the first coolant pump, the second coolant pump, and the directional control valve.

15. The water supply module of claim 1, wherein the reservoir tank comprises:
a first mounting part concavely formed on a first side in a longitudinal direction, wherein the heat exchanger is mounted on the first mounting part; and
a second mounting part concavely formed on a second side in the longitudinal direction, wherein the controller is mounted on the second mounting part.

16. An electric device cooling system comprising:
a water supply module comprising:
a reservoir tank that is partitioned to accommodate a first coolant and a second coolant having different temperatures, wherein an inner space of the reservoir tank is partitioned by a partition wall to define a first accommodating part configured to accommodate the first coolant and a second accommodating part configured to accommodate the second coolant;
a heat exchanger coupled to the reservoir tank and comprising a first coolant passage and a second coolant passage through which the first coolant and the second coolant flow and a refrigerant passage capable of exchanging heat with the first coolant passage and the second coolant passage, wherein in the heat exchanger, the first coolant and the second coolant are partitioned and flow without mixing;
a controller coupled to the reservoir tank and comprising a directional control valve configured to control a flow of the first coolant and the second coolant in a plurality of directions, wherein the reservoir tank is provided with a through passage through which the heat exchanger and the controller that is disposed on an opposite side communicate with each other and which does not communicate with the first accommodating part and the second accommodating part of the reservoir tank, and wherein the controller is configured to:
  communicate with the first accommodating part and the second accommodating part of the reservoir tank, respectively;
  communicate with the first coolant passage and the second coolant passage of the heat exchanger, respectively; and
  control the flow of the first coolant and the second coolant in at least six directions; and
a first coolant pump and a second coolant pump coupled to and in communication with the controller;
a first electrical component connected between a coolant outlet of the first coolant pump and a first coolant inlet of the heat exchanger, the coolant outlet of the first coolant pump and the first coolant inlet of the heat exchanger being connected; and
a second electrical component connected between a coolant outlet of the second coolant pump and a second coolant inlet of the heat exchanger, the coolant outlet of the second coolant pump and the second coolant inlet of the heat exchanger being connected.

17. The electric device cooling system of claim 16, wherein:
  the first accommodating part of the reservoir tank and the first coolant inlet of the heat exchanger are connected in parallel with the first electrical component; and
  the second accommodating part of the reservoir tank and the second coolant inlet of the heat exchanger are connected in parallel with the second electrical component.

18. The electric device cooling system of claim 16, further comprising:
  a first radiator connected between a coolant outlet of the first electrical component and the first accommodating part of the reservoir tank; and
  a second radiator connected between a coolant outlet of the second electrical component and the second accommodating part of the reservoir tank.

* * * * *